United States Patent [19]
Bigler et al.

[11] Patent Number: 5,517,056
[45] Date of Patent: May 14, 1996

[54] MOLDED CARRIER RING LEADFRAME HAVING A PARTICULAR RESIN INJECTING AREA DESIGN FOR GATE REMOVAL AND SEMICONDUCTOR DEVICE EMPLOYING THE SAME

[75] Inventors: Charles G. Bigler; Alan H. Woosley; Michael B. McShane, all of Austin, Tex.

[73] Assignee: Motorola, Inc., Schaumburg, Ill.

[21] Appl. No.: 129,503

[22] Filed: Sep. 30, 1993

[51] Int. Cl.⁶ .......................... H01L 23/495; H01L 23/02
[52] U.S. Cl. .......................... 257/666; 257/670; 257/669; 257/667
[58] Field of Search .................................. 257/666, 667, 257/670, 676, 669, 787

[56] References Cited

U.S. PATENT DOCUMENTS

| | | | |
|---|---|---|---|
| 4,301,464 | 11/1981 | Otsuki et al. | 257/670 |
| 4,400,714 | 8/1983 | Brown | 257/669 |
| 4,868,635 | 9/1989 | Frechette et al. | 257/667 |
| 4,897,602 | 1/1990 | Lin et al. | 324/158 |
| 4,915,607 | 4/1990 | Medders et al. | 425/116 |
| 5,168,345 | 12/1992 | Brossart | 257/668 |
| 5,223,738 | 6/1993 | Okada | 257/666 |
| 5,381,037 | 1/1995 | Olivarez | 257/676 |

FOREIGN PATENT DOCUMENTS

| | | | |
|---|---|---|---|
| 1243566 | 9/1989 | Japan | 257/667 |
| 2052459 | 2/1990 | Japan | 257/669 |
| 2202042 | 8/1990 | Japan | 257/667 |
| 5343587 | 12/1993 | Japan | 257/667 |

*Primary Examiner*—Sara W. Crane
*Assistant Examiner*—Jhihan Clark
*Attorney, Agent, or Firm*—Minh-Hien N. Clark

[57] ABSTRACT

A leadframe (30) having a novel resin injecting area (44) is disclosed to facilitate and control the removal of a molded gate (18) prior to excising a semiconductor device(70) from a carrier ring (14). The carrier ring has a corner which is on a diagonal with a corner of the package body (12) to form the resin injecting area. The resin injecting area of the leadframe has a hole (48) and an extension bar (50) extending from the hole to connect to a tie bar (36), which supports a die pad (32), inside the package body. The hole in the leadframe is designed for retaining a molded gate. The extension bar is designed to make the removal of a portion of a molded gate easier and more controllable. The semiconductor device can be shipped in the carrier ring with a portion of the molded gate already removed.

11 Claims, 6 Drawing Sheets

MOLDED CARRIER RING LEADFRAME HAVING A PARTICULAR RESIN INJECTING AREA DESIGN FOR GATE REMOVAL AND SEMICONDUCTOR DEVICE EMPLOYING THE SAME

FIELD OF THE INVENTION

The present invention relates to a leadframe for a semiconductor device in general, and more specifically a leadframe having a particular resin injecting corner design for controlled gate removal and a semiconductor device employing the same.

BACKGROUND OF THE INVENTION

Plastic encapsulated semiconductor devices having high lead counts or fine lead pitch are often times manufactured with a molded stiff carrier ring surrounding the package body of the device. The carrier ring supports the leads of the device for burn-in, test, probe, handling, and shipping purposes. Having the stiff carrier ring prevents damage, such as lead bending and lead skew, of the device during the aforementioned operations. When the device is ready to be mounted on a printed circuit board or a next level interconnect, the package body and the leads are excised from the carrier ring. The cut leads are then formed into a desired external lead configuration for mounting.

Figure 1:
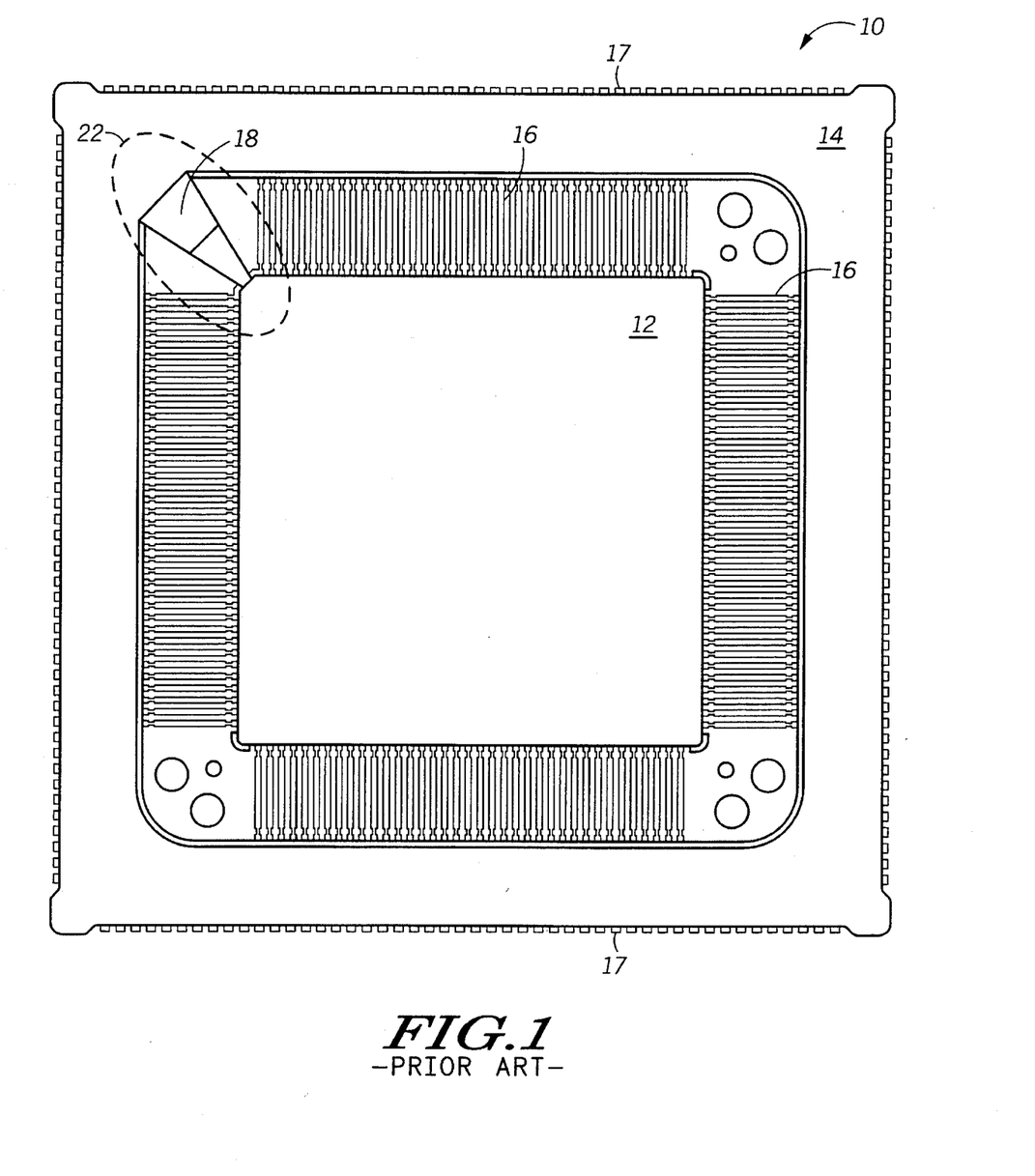
FIG. 1 illustrates, in a top view, a semiconductor device in a molded carrier ring as known in the prior art.

FIG. 1 illustrates a typical semiconductor device 10 as known in the prior art. Device 10 has a package body 12, a molded carrier ring 14, a plurality of leads 16 that extend from the package body 12 to the carrier ring 14, and a plurality of test contacts 17. Test contacts 17 are electrically interconnected to the leads 16, and thus allow testing of the device in the carrier ring. Occasionally, devices are tested by test probes contacting the leads 16 while they are still attached to the carrier ring.

Additionally illustrated in FIG. 1 is a molded gate 18 in a corner of the carrier ring, wherein the gate 18 extends from the inner corner of the carrier ring to a corner of the package body 12. The gate 18 serves as a conduit for the injection of resin from the carrier ring to the package body during a molding process. In a conventional mold, the resin compound is injected into a first cavity through a first gate (not illustrated) to form the carrier ring. After the resin compound fills the first cavity to form the carrier ring, the resin is fed from the first cavity through the gate 18 into a second cavity to form the package body 12.

Figure 2:
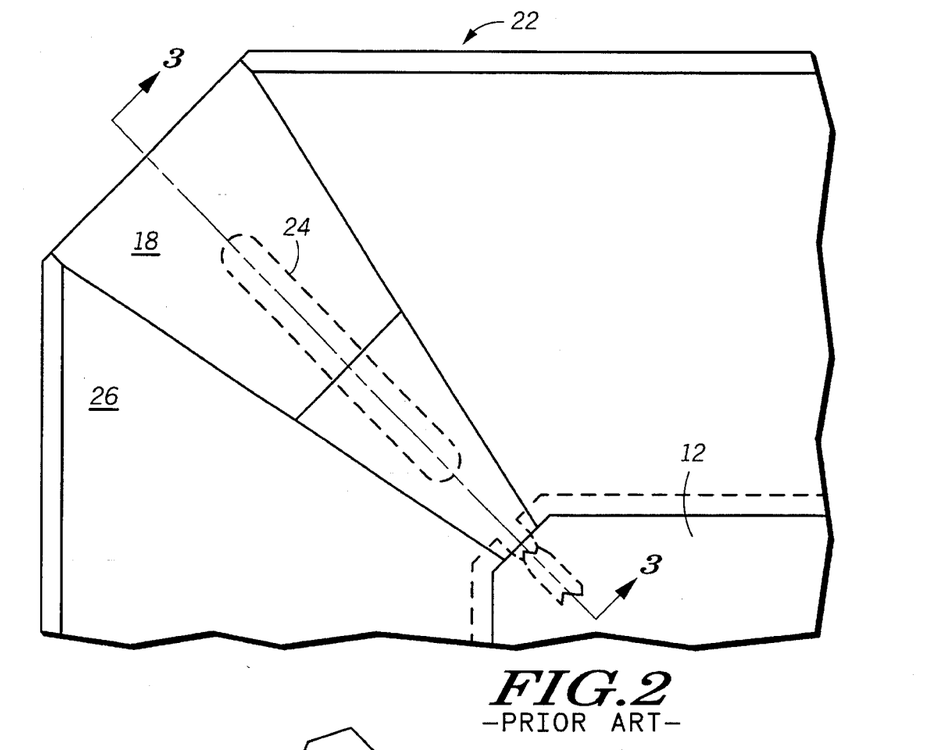
FIG. 2 illustrates, in detail, the resin injecting corner of FIG. 1.
Figure 3:
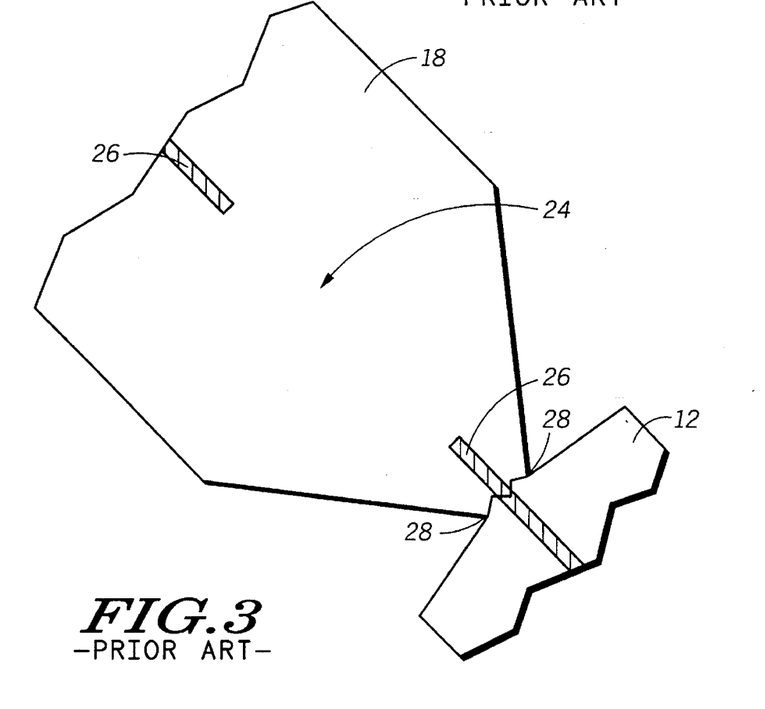
FIG. 3 illustrates, in cross-section, the resin injecting corner of FIG. 2.

FIG. 2 illustrates in detail the resin injecting area 22 of FIG. 1. The dotted line is used to indicate the metal leadframe underneath the molded gate 18. In the prior art, a slot 24 is designed into the leadframe to lock the gate 18 in place to prevent it from breaking away from the metal leadframe. The intent of the slot 24 in the prior art was to prevent premature breakage of the gate by interlocking of the top half of the gate to the bottom half of the gate on the underside of the leadframe. This feature is best understood by referring to FIG. 3 which illustrates a cross sectional view along line 3—3 of the gate 18 of FIG. 2. As shown, the large slot 24 in the leadframe 26 allows a joining and thus interlocking of the two halves of the gate. The corners 28 where the gate joins the package body 12 are the designated areas where the gate would break during a gate removal operation.

A gate removal operation typically precedes the package excising operation and the lead forming operation. One of the problems encountered by users of the semiconductor devices in a molded carrier ring is damage of formed leads during the operation of lead forming. Broken pieces of molded plastic can become embedded in the leads to cause misshapen formed leads or otherwise damage the plating on the leads. One source of the broken pieces of plastic is the molded gate during the gate removal operation because the gate breakage is typically not uniform or easily controlled. It would, thus, be desirable to be able to remove the gate without creating broken pieces of the plastic that could become embedded in the leads or the mechanical tooling associated with lead forming.

SUMMARY OF THE INVENTION

The present invention provides in one embodiment, a leadframe for a semiconductor device having a molded carrier ring. The leadframe has a novel resin injecting area to facilitate and control the removal of a molded gate prior to excising the semiconductor device from the carrier ring. The leadframe has a die pad for mounting a semiconductor die. A plurality of inner leads are disposed around the die pad. The die pad and the plurality of inner leads are disposed within a rectangular semiconductor device forming area of the leadframe. The device forming area has a corner. The carrier ring forming area encircles the semiconductor device forming area. The carrier ring forming area has a corner which is on a diagonal with the corner of the semiconductor device forming area. A plurality of external leads, which are integrally connected to the plurality of inner leads, are disposed between the semiconductor device forming area and the carrier ring forming area. A plurality of tie bars support the die pad within the semiconductor device forming area. There is also an outer frame integral with, supporting, and connected to the plurality of external leads and tie bars. A resin injecting area is disposed at the corner of the carrier ring forming area and extends to the corner of the semiconductor device forming area for injecting a sealing resin. The resin injecting area has a hole and an extension bar extending from the hole to connect to one of the plurality of tie bars. The hole in the leadframe is designed for retaining a molded gate. The extension bar is designed to facilitate the removal of a portion of a molded gate. The invention also provides a semiconductor device having a carrier ring which employs the leadframe disclosed.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 4:
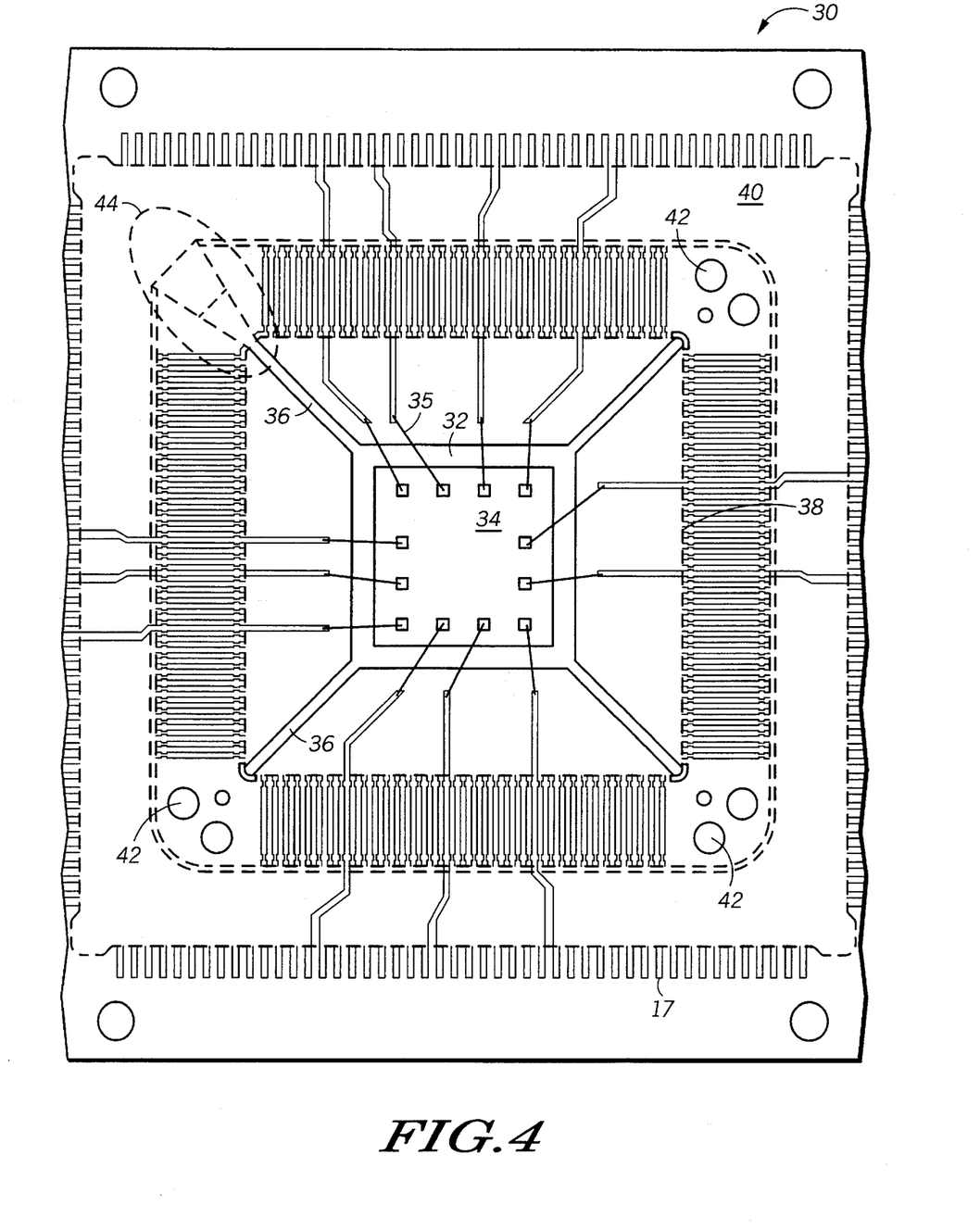
FIG. 4 illustrates, in a top view, a leadframe in an embodiment of the present invention.

FIG. 4 illustrates, in a top view, a leadframe 30 for a semiconductor device, in accordance with an embodiment of the present invention. Only an individual unit on a leadframe is shown for ease of illustration, although leadframes are typically manufactured in strip form with multiple units per strip. Furthermore, only a few leads are shown to be completely connected from the inner portion to the outer portion of the leadframe. It should be understood that a working leadframe design will have all the leads connected per the given design. FIG. 4 is only intended to be a representative leadframe. Leadframe 30 can be manufactured from a number of different materials, such as copper, nickel, iron, aluminum, or any alloy thereof. Examples include alloy 42, which is an iron-nickel alloy, and Olin CDA-194 (tradename), which is a copper-iron alloy. Other materials such as aluminum clad metals may also be used to practice the invention.

Leadframe 30 has a die pad 32 for mounting a semiconductor die 34. Semiconductor die 34 is connected by wires 35 to the plurality of leads 16 to electrically connect the semiconductor die to the leadframe. Methods of mounting a semiconductor die to a die pad and of wire bonding are well known in the art. Although die pad 32 is illustrated to be a complete surface, other die pad configurations, such as a die pad with a large centrally located hole or an X-flag configuration, may also be used. Alternatively, leadframe 30 could also be a flagless leadframe configuration, wherein the semiconductor die is supported by some other means. For example, the semiconductor die could be directly supported by the leads.

A plurality of tie bars 36 support the die pad 32 and are connected to an outer frame of the leadframe. The leadframe has a rectangular semiconductor device forming area 38 and a rectangular carrier ring forming area 40. The carrier ring forming area 40 encircles the semiconductor device forming area 38. The corners of the carrier ring forming area 40 are diagonally connected with the corners of the semiconductor device forming area 38. Three of the corners extending from the semiconductor device forming area to the carrier ring forming area have a plurality of tooling and/or registration holes 42. These holes are used for alignment and indexing of the leadframe during the assembly process. These holes are also used for the test and burn-in operations and the lead forming operation performed immediately prior to the mounting of the device on a printed circuit board (not illustrated). The fourth corner area forms a resin injecting area 44. This corner is typically chamfered as illustrated in the figure. The resin injecting area 44 has a novel design for overcoming the problems encountered in the prior art.

Figure 5:
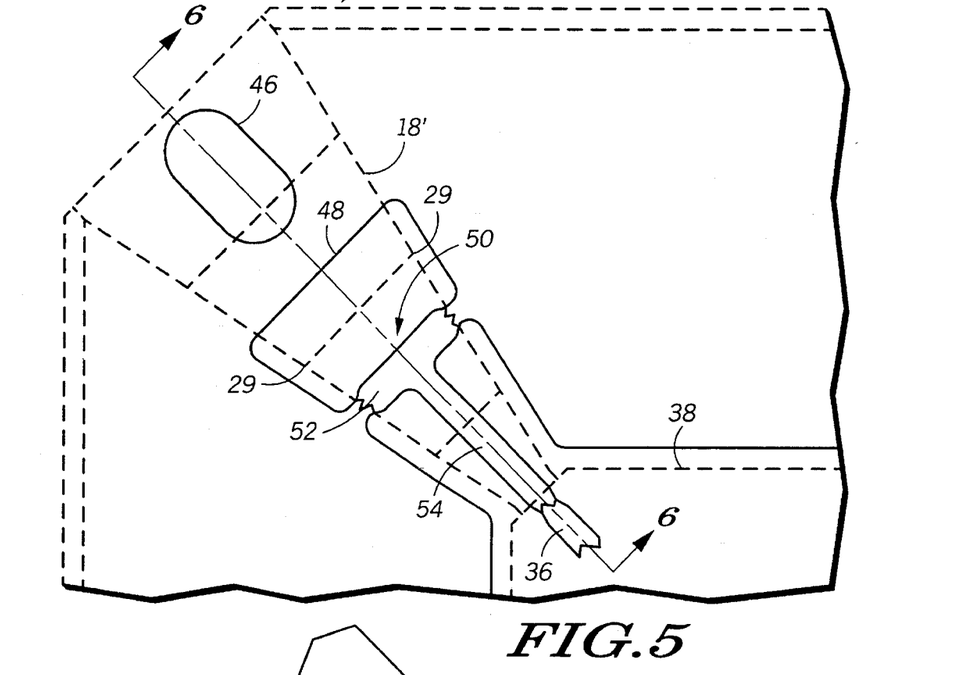
FIG. 5 illustrates, in detail, the resin injecting corner of FIG. 4 in accordance with a first embodiment of the present invention.

FIG. 5 illustrates in detail in the resin injecting area 44 of FIG. 4, in accordance with a first embodiment of the invention. The dotted line is shown to indicate where a molded gate 18' would be after the molding process. The resin injecting area 44 has a two holes 46 and 48. The hole 46 nearest the carrier ring forming area is designed for interlocking the two halves of the molded gate so that it does not prematurely break away from the leadframe prior to and during the actual gate removal operation. The other hole 48 is located in an intermediate region between the hole 46 and the semiconductor device forming area. The hole 48 is designed in an area where it would be desirable to break a portion of the gate prior to the excising process step. Although FIG. 5 shows the holes 46 and 48 as being oblong shaped, it should be apparent that holes of other shapes are also acceptable, such as ellipsoid or rectangular. Circles and squares fall within the general definition of an ellipse and a rectangle, respectively.

Also illustrated in FIG. 5 is an extension bar 50 that extends from the hole 48 toward the semiconductor device forming area. The extension bar 50 is T-shaped with a cross bar 52 and a longitudinal bar 54. The longitudinal bar 54 extends toward the semiconductor device forming area to connect to one of the tie bars 36 that supports the die pad. The longitudinal bar 54 necks-down before it connects to the tie bar 36. The necked area facilitates the breaking of the extension bar 50 from the tie bar 36 during the gate removal operation. The cross bar 52 of the extension bar can also have necked areas as illustrated in FIG. 5. The necked areas are stress concentration points so that those areas break first under stress. Therefore, it is desirable to design the stress concentration points where one wants the gate to break. Another way to make the gate break at a the desired places is to decrease the thickness of the plastic in those areas. Reducing the width of the gate in the desired breaking area will further reduce the cross-section. This feature is shown in FIG. 6 which is a cross-sectional view along line 6—6 of FIG. 5 with a molded gate 18' in place.

Figure 6:
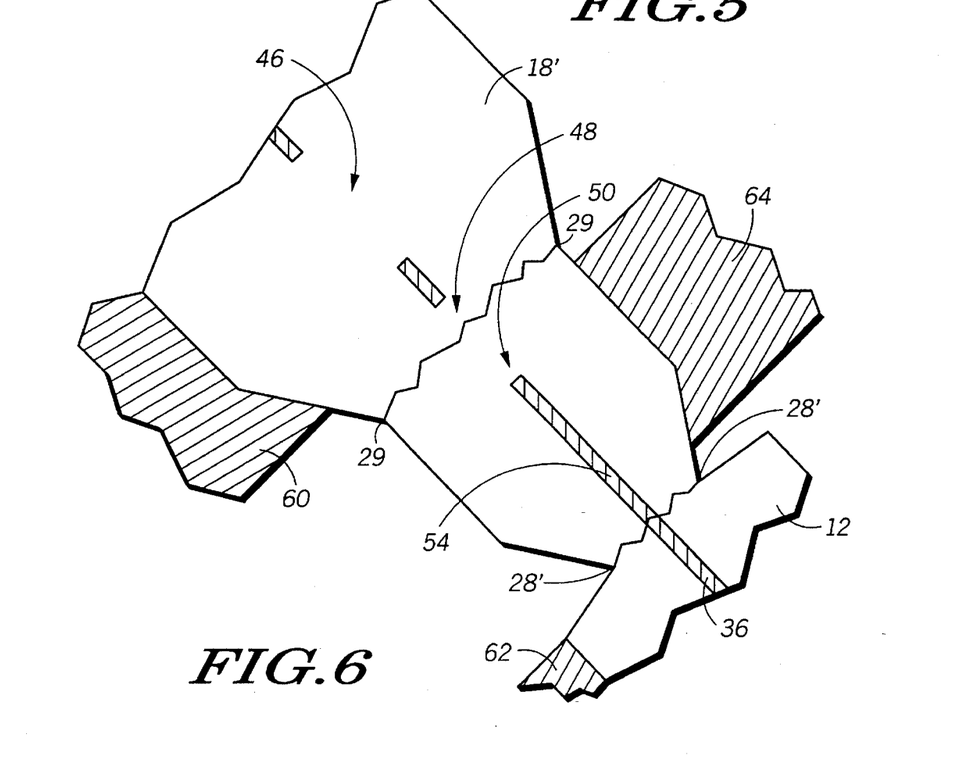
FIG. 6 illustrates, in cross-section, the resin injecting corner of FIG. 5.

As can be seen in FIG. 6, the two halves of the molded plastic gate 18' are interlocked by the presence of the two holes 46 and 48. The shape of the gate is modified from that as shown in the prior art to facilitate the controlled breakage of the gate during the gate removal operation. The thickness of the gate is designed to sharply change at 28' and 29, in the area of the second hole 48 and at the intersection of the gate 18' to the package body 12. The sharp areas 28' and 29 are stress concentration points to help the plastic break in the desired area. The break is easier to accomplish because there is less material to punch out. The plastic cross section is reduced and the location of the second hole 48 is strategically located in the break area.

It is envisioned that during the gate removal process, a portion of the gate 18' and the package body 12 would be supported by tooling 60 and 62. A gate removal punch 64 would then be used to punch out that portion of the gate extending from the second hole 48 to the package body 12. By removing this portion of the gate prior to the excising and lead forming steps, no broken plastic pieces will fall into the tooling and become embedded into the leads causing lead damage. The removing of the gate with the new leadframe design is most advantageously performed when the portion of the gate is removed prior to shipping of the devices in the carrier ring to the end user. The end user does not have to be concerned with broken pieces of the gate falling into the tooling and causing damage. The remaining portion of the gate is locked into place by the presence of the first hole 46. This portion of the gate remains attached to the carrier ring and thus will be discarded with the carrier ring after the device is excised. The portion of the gate that is punched out can be vacuumed away from the tooling so that the broken gate pieces do not cause damage to the breakout tooling.

Figure 7:
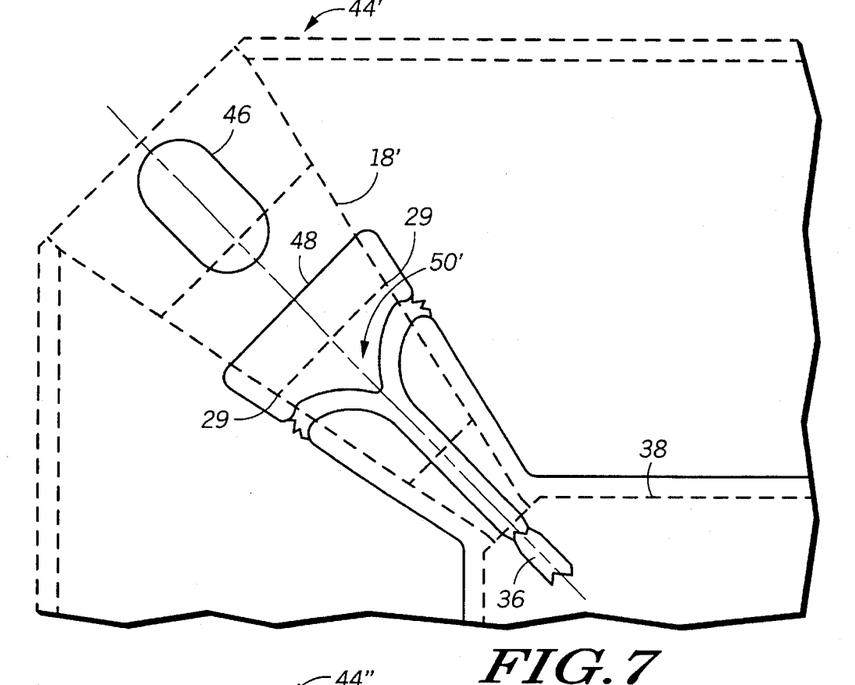
FIG. 7 illustrates, in detail, an alternative design for the resin injecting corner of FIG. 4, in accordance with a second embodiment of the invention.
Figure 8:
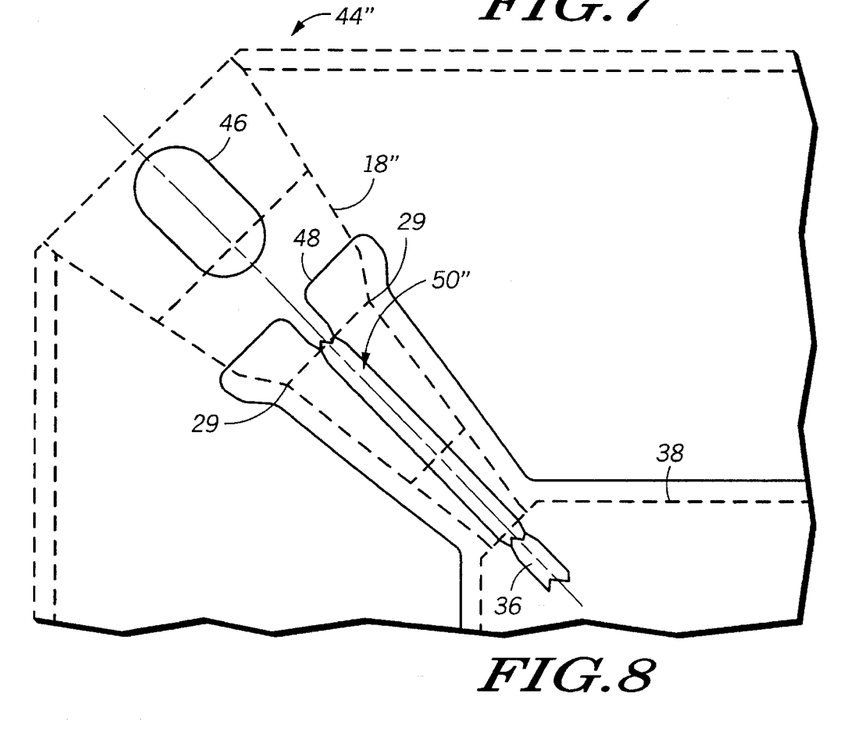
FIG. 8 illustrates, in detail, yet another design for the resin injecting corner of FIG. 4, in accordance with a third embodiment of the invention.

Illustrated in FIGS. 7 and 8 are alternative extension bar designs for the resin injecting area of a leadframe in accordance with the present invention. FIG. 7 shows a Y-shape extension bar 50'. The longitudinal portion of the Y-shape has a neck-down region at its intersection with the tie bar inside the semiconductor device forming area. FIG. 8 shows a straight longitudinal extension bar 50" in another variation of extension bar design. Again, the bar can have neck-down regions corresponding to desired break lines. It should be obvious that the extension bar design can vary while still retaining its intended function.

Figure 9:
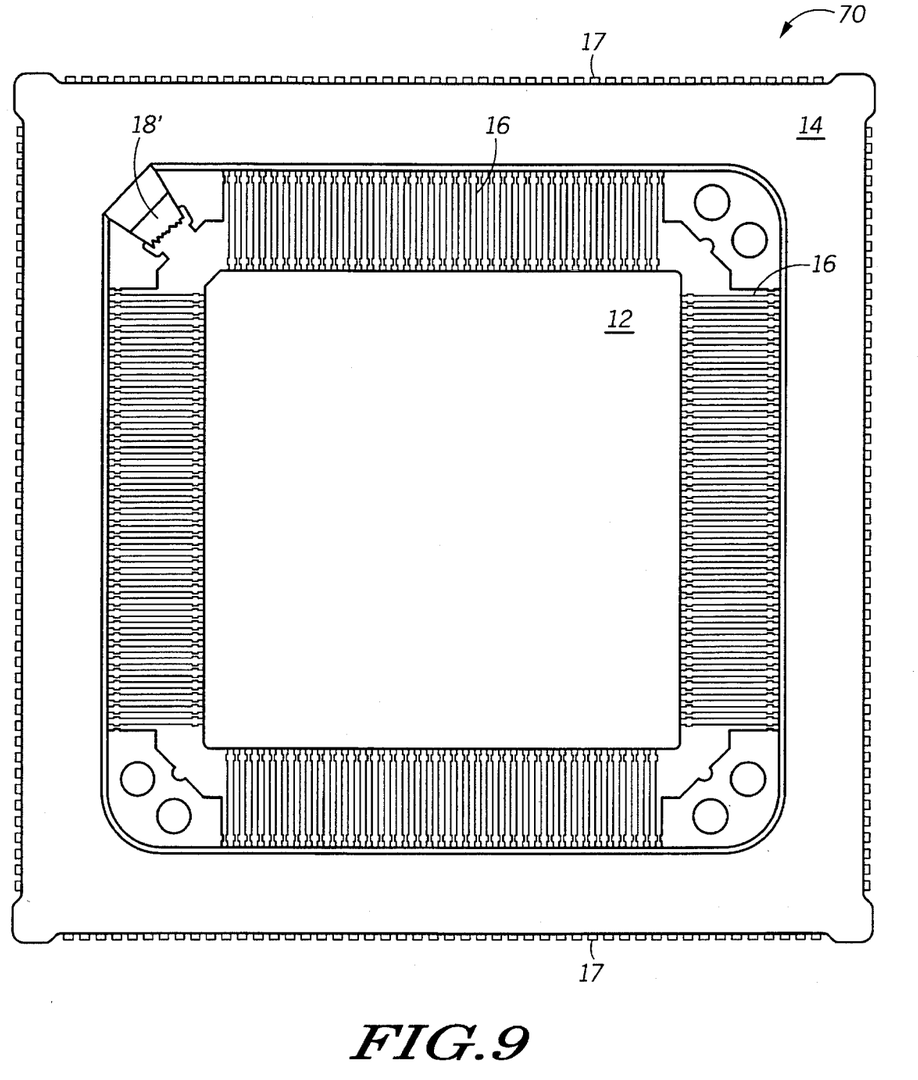
FIG. 9 illustrates, in a top view, a semiconductor device with a molded carrier ring with a portion of the resin injecting corner removed in accordance with the present invention.

FIG. 9 illustrates, in a top view, a semiconductor device 70 having package body 12, carrier ring 14, plurality of leads 16, and a plurality of test contacts 17. The package body 12 and carrier ring 14 are formed from conventional molding process which is well known in the art. The gate 18' has been partially punched out as well as the other three remaining corners. By punching out the four corners surrounding the package body, the tie bars are severed from the outer frame. Thus, the package body 12 is held within the carrier ring solely by the plurality of leads 16. During an excising process, only the leads need be trimmed and formed. The tooling does not have to punch through any plastic which simplifies the design of the tool. The risk of having broken pieces of plastic becoming embedded in the leads during the lead forming process is eliminated by practicing the invention.

The gate 18' in FIG. 9 has been partially removed from the device 70. The break lines of the gate 18' correspond to the sharp thickness reliefs shown in FIG. 6. The punching tool only has to cut through the plastic molded gate because the location of the second hole is intentionally designed in the desired break away area. Punching through pure plastic is easier on the tooling than punching through a combination of both plastic and metal, as was the case in the prior art. Less wearing of the tooling is experienced in practicing the present invention. The gate and corner removals are best when performed after the molding process in conjunction with the dam bar removal steps. Dam bar removal is a standard process in the art. The tooling would have to be modified to punch out the corners, but no additional operations would be added to the assembly and test process flow.

The foregoing description and illustrations contained herein demonstrate many of the advantages associated with the present invention. In particular, it has been revealed that a novel resin injecting corner having an extension bar facilitates and controls the removal of a molded gate without creating broken pieces of plastic that can damage tooling or leads. Moreover, standard assembly techniques including molding using conventional transfer molding equipment can be used with the leadframe. The resin injecting area allows the controlled removal of a portion of a molded gate without creating the risk of subsequent lead damage. Another advantage in practicing the present invention is that the tooling which must be present at the operation which mounts the device to a printed circuit board is simplified and less susceptible to damage.

Thus it is apparent that there has been provided, in accordance with the invention, a leadframe for a semiconductor device in a carrier ring that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the configuration of the extension bar can vary and still perform its function. Only a few variations have been illustrated such as the T-shape bar, the Y-shape bar, and the straight longitudinal bar. However, any number of variations in the shape of the extension bar is practicable such as an inverted T-shape or a V-shape. Also, the leadframe may have more than one die pad. In addition, the invention is not limited to any lead count or lead pitch as long the leadframe is for a semiconductor device having a carrier ring. Furthermore, the shape of the carrier ring and the shape of the semiconductor package body do not have to be the same. For example, a square carrier ring may be used in conjunction with a square package body or a rectangular package body. It is also important to note that the present invention is not limited in any way to a double sided gate. Use of the resin injecting corner with the extension bar can be extended to a single sided gate design. Furthermore, the invention can be used in conjunction with a molded TAB (tape automated bond) configuration. The portion of the device inside the semiconductor device forming area can be a flexible TAB leadframe. The inner TAB leadframe can be connected to an outer rigid leadframe for forming a molded carrier ring. The resin injecting corner with an extension bar would still perform its intended function which is the easy and controlled removal of the molded gate. Therefore, it is intended that this invention encompass all such variations and modifications falling within the scope of the appended claims.

We claim:

1. A leadframe for a semiconductor device having a molded carrier ring, comprising:

a die pad for mounting a semiconductor die;

a plurality of inner lead portions disposed around the die pad, wherein the die pad and the plurality of inner lead portions are disposed within a rectangular semiconductor device forming area of the leadframe, the semiconductor device forming area having a corner;

a rectangular carrier ring forming area on the leadframe, the carrier ring forming area encircling the semiconductor device forming area and having a corner which is on a diagonal to the corner of the semiconductor device forming area;

a plurality of external lead portions integrally connected to the plurality of inner lead portions, the plurality of external lead portions being disposed in an area between the semiconductor device forming area and the carrier ring forming area;

a plurality of tie bars supporting the die pad within the semiconductor device forming area;

an outer frame integral with, supporting, and connected to the plurality of external leads and tie bars;

a resin injecting area disposed at the corner of the carrier ring forming area and extending to the corner of the semiconductor device forming area for injecting a sealing resin, the resin injecting area having a first hole, other than a registration hole, and a second hole, other than a registration hole, located near the carrier ring forming area, wherein the first hole is located in an intermediate region between the second hole and the semiconductor device forming area; and an extension bar which extends from the first hole in the resin injecting area to connect to one of the plurality of tie bars in the semiconductor device forming area, wherein the extension bar is disposed within the resin injecting area.

2. The leadframe according to claim 1, wherein the extension bar has a T-shaped configuration as defined by a cross bar and a longitudinal bar, wherein the longitudinal bar has a neck-down region inside the semiconductor device forming area prior to connecting to said one of the plurality of tie bars.

3. The leadframe according to claim 2, wherein the cross bar has a second neck-down region at an end of the cross bar.

4. A packaged semiconductor device having a molded carrier ring, comprising:

a semiconductor die;

a plurality of inner lead portions on a leadframe disposed around and electrically connected to the semiconductor die, wherein the semiconductor die and the plurality of inner lead portions are disposed within a rectangular semiconductor device forming area of the leadframe, the semiconductor device forming area having a corner;

a molded carrier ring encircling the semiconductor device forming area and having a corner which is on a diagonal with the corner of the semiconductor device forming area;

a plurality of external lead portions integrally connected to the plurality of inner leads, the plurality of external lead portions being disposed in an area between the semiconductor device forming area and the molded carrier ring;

a resin injecting area on the leadframe disposed at the corner of the molded carrier ring and extending to the corner of the semiconductor device forming area for injecting a sealing resin, the resin injecting area having a first hole other than a registration hole near the molded carrier ring and a second hole other than a registration hole in an intermediate region between the first hole and the semiconductor device forming area, wherein the second hole enables an extension bar to extend therefrom into the semiconductor device forming area;

a rectangular resin package body in the semiconductor device forming area to encapsulate the semiconductor die and the plurality of inner lead portions; and a partially removed molded gate in the resin injecting area extending from the molded carrier ring toward the package body and terminating at the second hole.

5. The device of claim 4, wherein the first hole is an ellipse.

6. The device of claim 4, further comprising a die pad upon which the semiconductor die is mounted.

7. The device of claim 4, further comprising a plurality of test contacts connected to respective leads, the plurality of test contacts being located outside the carrier ring.

8. The device of claim 4, wherein the leadframe comprises a material selected from a group consisting of: copper, nickle, iron, aluminum, and any alloy thereof.

9. A packaged semiconductor device having a molded carrier ring, comprising:

a semiconductor die mounted on a die pad of a leadframe;

a plurality of inner lead portions disposed around and electrically connected to the semiconductor die, wherein the semiconductor die and the plurality of inner lead portions are disposed within a rectangular semiconductor device forming area of the leadframe, the semiconductor device forming area having a corner;

a plurality of tie bars supporting the die pad, the plurality of tie bars being disposed within the semiconductor device forming area;

a molded carrier ring encircling the semiconductor device forming area and having a corner which is on a diagonal with the corner of the semiconductor device forming area;

a plurality of external lead portions integrally connected to the plurality of inner leads, the plurality of external leads being disposed in an area between the semiconductor device forming area and the molded carrier ring;

a resin injecting area on the leadframe disposed at the corner of the molded carrier ring and extending to the corner of the semiconductor device forming area for injecting a sealing resin, the resin injecting area having a first hole, other than a registration hole, and a second hole, other than a registration hole, located near the molded carrier ring, wherein the first hole is located in an intermediate region between the second hole and the semiconductor device forming area;

an extension bar which extends from the first hole in the resin injecting area to connect to one of the plurality of tie bars in the semiconductor device forming area, wherein the extension bar is disposed within the resin injecting area;

a rectangular resin package body in the semiconductor device forming area to encapsulate the semiconductor die, the plurality of tie bars, and the plurality of inner leads; and a molded gate in the resin injecting area extending from the molded carrier ring toward the package body.

10. The device of claim 9, wherein the extension bar has a T-shaped configuration as defined by a cross bar and a longitudinal bar, wherein the longitudinal bar has a neck-down region inside the resin package body prior to connecting to said one of the plurality of tie bars.

11. The device of claim 10, wherein the cross bar has a second neck-down region at an end of the cross bar.

* * * * *